(12) United States Patent
Park et al.

(10) Patent No.: US 7,342,249 B2
(45) Date of Patent: Mar. 11, 2008

(54) ORGANIC ELECTROLUMINESCENT DEVICE AND FABRICATING METHOD THEREOF

(75) Inventors: Jae-Yong Park, Annyang-si (KR); Kwang-Jo Hwang, Annyang-si (KR); Ock-Hee Kim, Annyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 223 days.

(21) Appl. No.: 10/876,573

(22) Filed: Jun. 28, 2004

(65) Prior Publication Data

US 2005/0139834 A1  Jun. 30, 2005

(30) Foreign Application Priority Data

Dec. 31, 2003  (KR) .................. 10-2003-0101280

(51) Int. Cl.
*H01L 29/04* (2006.01)
(52) U.S. Cl. .................. 257/59; 257/72; 257/83; 257/E27.131; 313/500
(58) Field of Classification Search .............. 257/59, 257/72, 83, 88, E27.131, E27.132; 313/500, 313/501, 505
See application file for complete search history.

(56) References Cited

U.S. PATENT DOCUMENTS

| | | | |
|---|---|---|---|
| 5,276,380 A | 1/1994 | Tang | |
| 5,294,869 A | 3/1994 | Tang et al. | |
| 5,294,870 A | 3/1994 | Tang et al. | |
| 5,701,055 A | 12/1997 | Nagayama et al. | |
| 5,742,129 A | 4/1998 | Nagayama et al. | |
| 5,952,037 A | 9/1999 | Nagayama et al. | |
| 6,046,547 A | 4/2000 | Nishio et al. | |
| 6,146,715 A * | 11/2000 | Kim et al. | .................. 427/555 |
| 6,175,345 B1 | 1/2001 | Kuribayashi et al. | |
| 6,373,455 B1 | 4/2002 | Kuribayashi et al. | |
| 6,548,961 B2 | 4/2003 | Barth et al. | |

(Continued)

FOREIGN PATENT DOCUMENTS

JP  2001-117509  4/2001

(Continued)

OTHER PUBLICATIONS

Woo Young Kim et al.; p. 32: Side-by-Side Patterned RGB Domain Color Device to Optimize Full Color OLED; LCD SBU, Hyundai Electronics Industries, Co., Ltd.; 4 pages.

*Primary Examiner*—Minh-Loan Tran
(74) *Attorney, Agent, or Firm*—McKenna, Long & Aldridge LLP

(57) ABSTRACT

An organic electroluminescent device, includes: a first substrate including a first pixel region, the first pixel region including first, second and third sub-pixel regions; an array element layer on an inner surface of the first substrate, the array element layer including a thin film transistor in each sub-pixel region; a second substrate facing the first substrate and being spaced apart from the first substrate, the second substrate including a second pixel region corresponding to the first pixel region, and the second pixel region including fourth, fifth and sixth sub-pixel regions; an organic electroluminescent diode on an inner surface of the second substrate in each sub-pixel region; and a connection electrode electrically connecting the first substrate to the second substrates, wherein the fourth, fifth and sixth sub-pixel regions have different sizes from each other.

57 Claims, 6 Drawing Sheets

U.S. PATENT DOCUMENTS

| | | |
|---|---|---|
| 6,633,134 B1 | 10/2003 | Kondo et al. |
| 6,747,618 B2 * | 6/2004 | Arnold et al. ............... 345/77 |
| 6,861,810 B2 * | 3/2005 | Rutherford ............. 315/169.3 |
| 7,012,366 B2 * | 3/2006 | Park et al. ................. 313/505 |
| 2002/0158577 A1 | 10/2002 | Shimoda et al. |
| 2003/0042848 A1 * | 3/2003 | Park et al. ................. 313/503 |
| 2004/0080262 A1 * | 4/2004 | Park et al. ................. 313/498 |

FOREIGN PATENT DOCUMENTS

| | | |
|---|---|---|
| KR | 2000-0076528 | 12/2000 |
| KR | 2003-0014283 | 3/2003 |
| WO | WO 02/078101 A1 | 10/2002 |

\* cited by examiner

ORGANIC ELECTROLUMINESCENT DEVICE AND FABRICATING METHOD THEREOF

The present invention claims the benefit of the Korean Patent Application No. 2003-101280 filed in Korea on Dec. 31, 2003, which is hereby incorporated by reference for all purposes as if fully set forth herein.

BACKGROUND OF THE INVENTION

1. Field of the Invention

The present invention relates to an organic electroluminescent device (ELD), and more particularly, to a dual panel type organic ELD and a method of fabrication thereof.

2. Discussion of the Related Art

In general, an organic ELD emits light by injecting electrons from a cathode and holes from an anode into an emission layer, combining the electrons with the holes, generating excitons, and transitioning the excitons from an excited state to a ground state. Compared to a liquid crystal display (LCD) device, an additional light source is not necessary for the organic ELD because the transition of the excitons between the two states causes light to be emitted. Accordingly, the size and weight of the organic ELD can be reduced. The organic ELD has other excellent characteristics such as low power consumption, superior brightness, and fast response time. Because of these characteristics, the organic ELD is regarded as a promising display for next-generation consumer electronic applications such as cellular phones, car navigation system (CNS), personal digital assistants (PDA), camcorders, and palmtop computers. Moreover, since fabricating the organic ELD is a simple process with a few processing steps, it is much cheaper to produce an organic ELD than an LCD device.

Two different types of organic ELDs exist: passive matrix and active matrix. While both the passive matrix organic ELD and the active matrix organic ELD have a simple structure and are formed by a simple fabricating process, the passive matrix organic ELD requires a relatively high amount of power to operate. In addition, the display size of a passive matrix organic ELD is limited by its structure. Furthermore, as the number of conductive lines increases, the aperture ratio of a passive matrix organic ELD decreases. In contrast, active matrix organic ELDs are highly efficient and can produce a high-quality image for a large display with a relatively low power.

In the meanwhile, organic ELDs are classified into bottom emission types and top emission types according to an emission direction of light used for displaying images via the organic ELDs.

FIG. 1 is a schematic cross-sectional view of a bottom emission type organic ELD according to a related art. Referring to FIG. 1, an array element layer 14 including a thin film transistor (TFT) "T" is formed on a first substrate 12. A first electrode 16, an organic electroluminescent (EL) layer 18, and a second electrode 20 are formed over the array element layer 14. The organic EL layer 18 may separately display red, green and blue colors for each sub-pixel region. The red, green and blue sub-pixel regions constitute one pixel region, as shown in FIG. 1. Generally, separate organic materials are used to emit light of each color for the organic EL layer in each sub-pixel region. The organic ELD is encapsulated by attaching the first substrate 12 to a second substrate 28 with a sealant 26. The organic ELD includes a moisture absorbent material 22 to eliminate moisture and oxygen that may penetrate into a capsule of the organic EL layer 18. After etching a portion of the second substrate 28, the etched portion is filled with the moisture absorbent 22, and the filled moisture absorbent is fixed by a holding element 25.

FIG. 2 is an equivalent circuit diagram of the organic ELD according to the related art. Referring to FIG. 2, a gate line "GL" crosses a data line "DL." A switching element "$T_S$" is connected to the gate line "GL" and the data line "DL," and is located at a crossing of the gate line "GL" and the data line "DL." A driving element "$T_D$" is electrically connected to the switching element "$T_S$" and an organic electroluminescent diode "$D_{EL}$." A storage capacitor "$C_{ST}$" is formed between a driving gate electrode "D2" and a driving drain electrode "D6" of the driving element "$T_D$," and the organic electroluminescent diode "$D_{EL}$" is connected to a power line "PL."

When a scan signal of the gate line "GL" is applied to a switching gate electrode "S2" of the switching element "$T_S$," an image signal of the data line "DL" is applied to the driving gate electrode "D2" of the driving element "$T_D$" through the switching element "$T_S$." The current density of the driving element "$T_D$" is modulated by the image signal applied to the driving gate electrode "D2." As a result, the organic electroluminescent diode "$D_{EL}$" can display images with gray scale levels. Moreover, since the image signal stored in the storage capacitor "$C_{ST}$" is applied to the driving gate electrode "D2," the current density flowing into the organic electroluminescent diode "$D_{EL}$" is uniformly maintained until the next image signal is applied, even when the switching element "$T_S$" is turned off. The switching element "$T_S$" and the driving element "$T_D$" can be formed of a polycrystalline silicon TFT or an amorphous silicon TFT. The process of fabricating an amorphous silicon TFT is simpler than the process for a polycrystalline silicon TFT.

As mentioned above, each of the red, green and blue colors is displayed in each of the sub-pixel regions, and the brightnesses of the sub-pixel regions are controlled by the current densities supplied from the driving TFTs to the organic electroluminescent layers of the sub-pixel regions. A desired color is displayed by combining the brightnesses of each sub-pixel region, which are adjusted by independently supplying different voltages to each sub-pixel region. However, this adjusting method requires a high current density for the sub-pixel regions, leading to a fast thermalization of the organic ELD, which in turn decreases the lifetime of the organic ELD.

To overcome this disadvantage, a driving method in which the same current level is applied to all the sub-pixel regions is suggested. However, since this method requires additional layers such as a hole transporting layer, a hole injection layer, an electron transporting layer and an electron injection as part of the organic electroluminescent layer, the fabrication process becomes complicated. Accordingly, it is difficult to obtain enough brightness for each color. Another method in which a higher driving voltage is applied to the organic EL layer is suggested. However, when the driving voltage becomes higher, the lifetime of the organic ELD decreases and the emission layer of the organic ELD becomes damaged.

SUMMARY OF THE INVENTION

Accordingly, the present invention is directed to an organic electroluminescent display device and a method of fabricating an organic electroluminescent device (ELD) that substantially obviate one or more of the problems due to limitations and disadvantages of the related art.

An advantage of the present invention is to provide an organic ELD with a high brightness and a high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes a first substrate including a first pixel region, the first pixel region including first, second and third sub-pixel regions; an array element layer on an inner surface of the first substrate, the array element layer including a thin film transistor in each sub-pixel region; a second substrate facing the first substrate and being spaced apart from the first substrate, the second substrate including a second pixel region corresponding to the first pixel region, and the second pixel region including fourth, fifth and sixth sub-pixel regions; an organic electroluminescent diode on an inner surface of the second substrate in each sub-pixel region; and a connection electrode electrically connecting the first substrate to the second substrates, wherein the fourth, fifth and sixth sub-pixel regions have different sizes from each other.

In another aspect, a method of fabricating an organic electroluminescent device includes forming an array element layer on a first substrate, the first substrate having a first pixel region, the first pixel region including first, second and third sub-pixel regions, and the array element including a thin film transistor in each sub-pixel region; forming an organic electroluminescent diode on a second substrate, the second substrate facing the first substrate and being spaced apart from the first substrate, the second substrate including a second pixel region corresponding to the first pixel region, and the second pixel region including fourth, fifth and sixth sub-pixel regions; and electrically connecting the first substrate to the second substrate by a connection electrode, wherein the fourth, fifth and sixth sub-pixel regions have different sizes from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the embodiments of the present invention, examples of which are illustrated in the accompanying drawings.

The present invention relates to a top emission type organic ELD. More particularly, the present invention relates to a dual panel type organic ELD in which an array element layer including a thin film transistor (TFT) and an organic EL element are formed on their respective substrates. Since an organic ELD according to present invention emits light in a top direction, aperture ratio need not be considered when an array element layer including TFTs is designed to be formed on the lower substrate.

Figure 1:
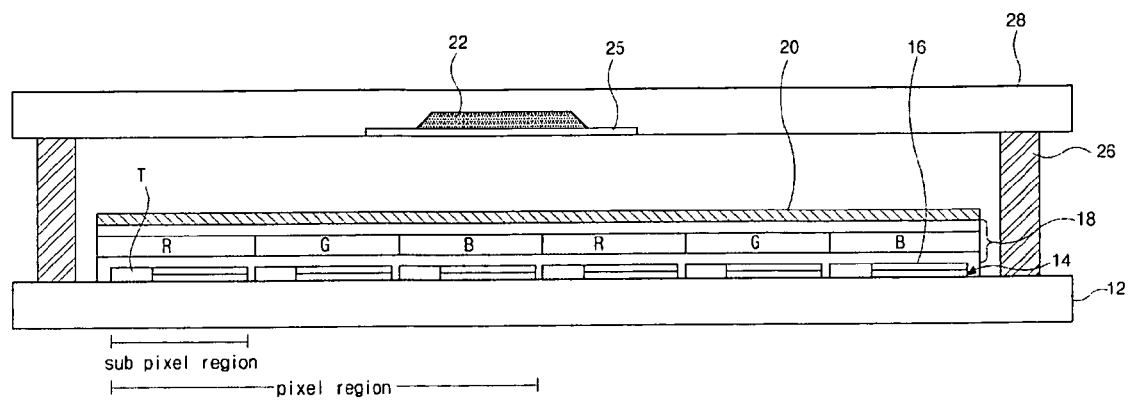
FIG. 1 is a schematic cross-sectional view of a bottom emission type organic ELD according to a related art.
Figure 2:
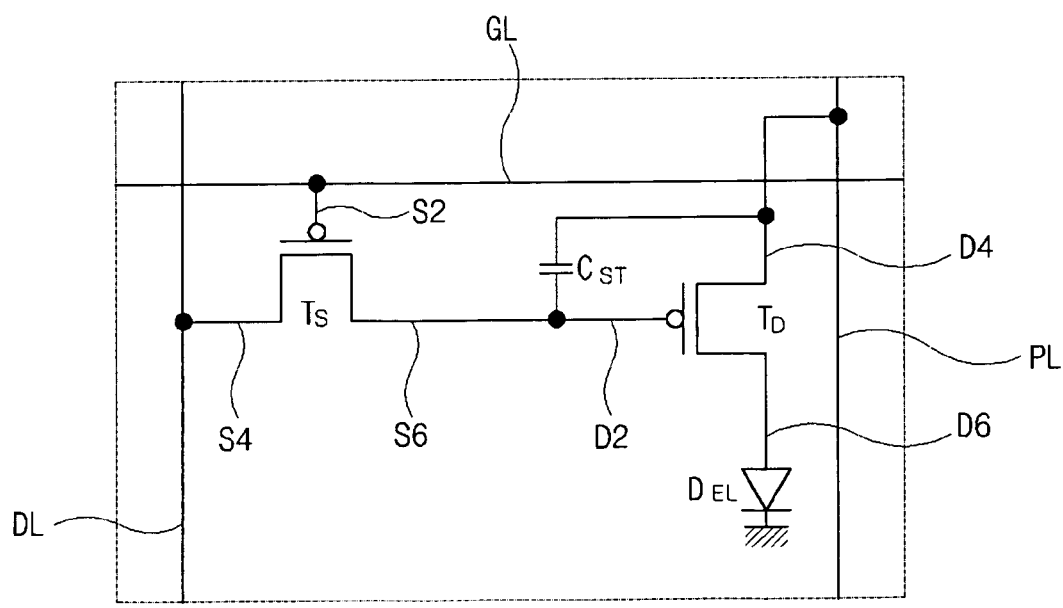
FIG. 2 is an equivalent circuit diagram of the organic ELD according to the related art.
Figure 3:
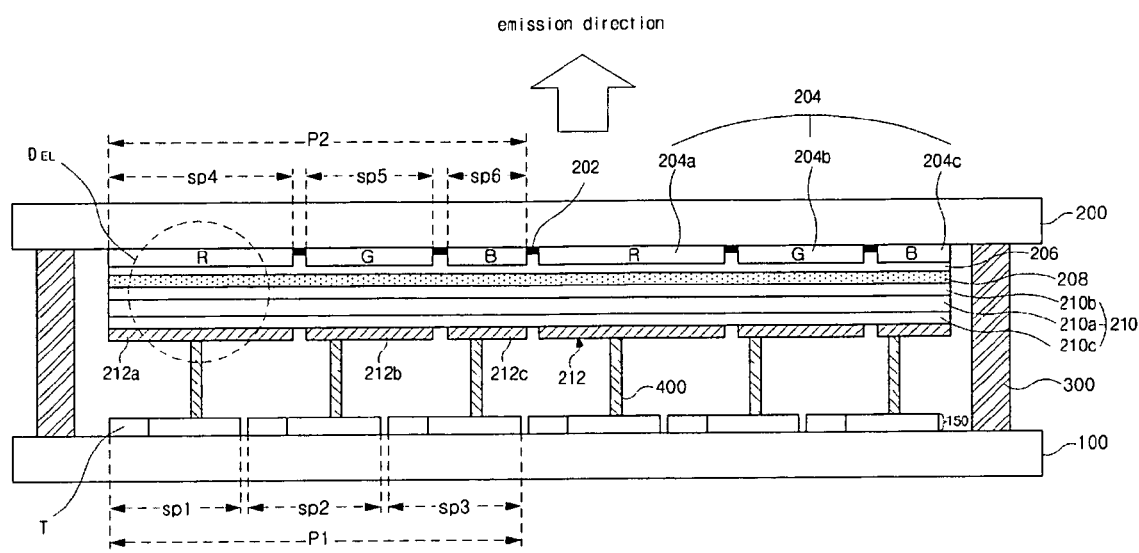
FIG. 3 is a schematic cross-sectional view illustrating a top emission type organic ELD having a dual panel structure according to an embodiment of the present invention.

FIG. 3 is a schematic cross-sectional view illustrating a top emission type organic ELD having a dual panel structure according to an embodiment of the present invention. Referring to FIG. 3, first and second substrates 100 and 200 face each other and are spaced apart from each other. First and second pixel regions "P1" and "P2" are defined in the first and second substrates 100 and 200, respectively. The first pixel region "P1" includes first, second and third sub-pixel regions "sp1", "sp2" and "sp3," and the second pixel region "P2" includes fourth, fifth and sixth sub-pixel regions "sp4", "sp5" and "sp6." The sub-pixel regions "sp1", "sp2" and "sp3" of the first pixel region "P1" have the same size, but the sub-pixel regions "sp4", "sp5" and "sp6" of the second pixel region "P2" have different sizes from each other. The first pixel region "P1" corresponds to the second pixel region "P2," but the sub-pixel regions "sp1", "sp2" and "sp3" of the first pixel region "P1" do not correspond to the sub-pixel regions "sp4", "sp5" and "sp6" of the second pixel region "P2," as shown in FIG. 3. The fourth, fifth and sixth sub-pixel regions "sp4", "sp5" and "sp6" emit red, green and blue colors, respectively.

Meanwhile, an array element layer 150 is formed on an inner surface of the first substrate 100 and includes a plurality of TFTs "T." The TFTs "T" are located in each of the sub-pixel regions "sp1", "sp2" and "sp3" of the first pixel region "P1."

A black matrix 202 is formed on an inner surface of the second substrate 200 and includes open portions (illustrated in FIG. 5A) corresponding to the sub-pixel regions "sp4", "sp5" or "sp6" of the second pixel regions "P2." Accordingly, the open portions include first, second and third open portions (not shown) corresponding to the fourth, fifth and sixth sub-pixel regions "sp4", "sp5" and "sp6." In addition, red, green and blue color filters 204a, 204b and 204c are formed in the first, second and third open portions of the black matrix 202 in the second pixel region "P2," respectively. Since the first, second and third open portions corresponding to the fourth, fifth and sixth sub-pixel regions "sp4", "sp5" and "sp6" have different sizes from each other, the sizes of the red, green and blue color filters 204a, 204b and 204c corresponding to the first to third open portions are also different from each other.

It should be noted that individual sizes of the sub-pixel regions "sp4", "sp5" or "sp6" of the second pixel region "P2" are inversely proportional to brightnesses thereof. In other words, in FIG. 3, the brightness of a blue sub-pixel region (the sixth sub-pixel region "sp6" corresponding to the blue color filter 204c) is the greatest of them, and the brightness of a green sub-pixel region (the fifth sub-pixel region "sp5" corresponding to the green color filter 204b) is greater than the brightness of a red sub-pixel region (the fourth sub-pixel region "sp4" corresponding to the red color filter 204a). Thus, the red color filter 204a is larger than the green and blue color filters 204b and 204c, and the green color filter 204b is larger than the blue color filter 204c. However, a total size of the red, green and blue color filters 204a, 204b and 204c does not exceed the size of the second pixel region "P2." The red, green and blue color filters 204a, 204b and 204c constitute a color filter layer 204.

An overcoat layer 206 is formed on the color filter layer 204 and the black matrix 202. This protects the color filter layer 204, and also contributes to uniformity of the connection electrodes and an organic EL layer that will be explained below. A first electrode 208 is formed on the overcoat layer 206, an organic EL layer 210 is formed on the first electrode 100, and a plurality of second electrodes 212a, 212b and 212c are formed on the organic EL layer 210. The second electrodes 212a, 212b and 212c are formed in the sub-pixel regions "sp4", "sp5" or "sp6" of the second pixel region "P2," respectively. The first and the second electrodes 208 and 212, and the organic EL layer 210 therebetween constitute an organic EL diode "$D_{EL}$."

It should be noted that the plurality of second electrodes 212a, 212b and 212c correspond to the sub-pixel regions "sp4", "sp5" and "sp6" of the second pixel region "P2," respectively. Thus, the second electrodes 212a, 212b and 212c corresponding to the fourth, fifth and sixth sub-pixel regions "sp4", "sp5" and "sp6" (and red, green and blue color filters 204a, 204b and 204c) have different sizes from each other. For example, when the red color filter 204a is larger than the green and the blue color filters 204b and 204c, and the green color filter 204b is larger than the blue color filter 204c, as shown in FIG. 3, the second electrode 212a corresponding to the red color filter 204a is larger than the second electrodes 212b and 212c, and the second electrode 212b corresponding to the green color filter 204b is larger than the second electrode 212c corresponding to the blue color filter 204c. That is, the size relationship between the red, green and blue color filters 204a, 204b and 204c is the same as the size relationship between the second electrodes 212a, 212b and 212c.

In addition, the organic EL layer 210 includes a single color emission layer 210a. A first current transmitting layer 210b is formed between the first electrode 208 and the emission layer 210a, and a second current transmitting layer 210c is formed between the emission layer 210a and the second electrodes 212a, 212b and 212c. When the first and second electrodes 208 and 212 function as an anode and a cathode, respectively, the first current transmitting layer 210a further includes a hole injection layer and a hole transporting layer, and the second current transmitting layer 210c further includes an electron injection layer and an electron transporting layer.

In addition, a plurality of connection electrodes 400 are formed between the first and second substrates 100 and 200, and electrically connect the first substrate 100 to the second substrate 200. Specifically, the organic EL diode "$D_{EL}$" and the array element layer 150 are electrically connected by the plurality of the connection electrodes 400. For example, the second electrode 212 and the TFT "T" are connected by the connection electrode 400 in each sub-pixel region. The connection electrode 400 may be formed on the first electrode 208 and be connected to the TFT "T" with an additional pattern. For example, the connection electrode 400 may be connected to the drain electrode (not shown) of to the TFT "T." Furthermore, the first and second substrates 100 and 200 are attached to each other with a seal pattern 300.

It should be noted that the sub-pixel regions "sp1", "sp2" and "sp3" of the first pixel region "P1" have the same size, but the sub-pixel regions "sp4", "sp5" or "sp6" of the second pixel region "P2" have different sizes from each other considering brightness. Accordingly, although different current levels are applied to each of the red, green and blue sub-pixel regions of the second pixel region "P2" by an independent driving method, current densities of the sub-pixel regions become lower due to the increased size of the sub-pixel region requiring the highest current. Therefore, thermalization of the organic EL layer 210 caused by current stress is minimized.

Figure 4:
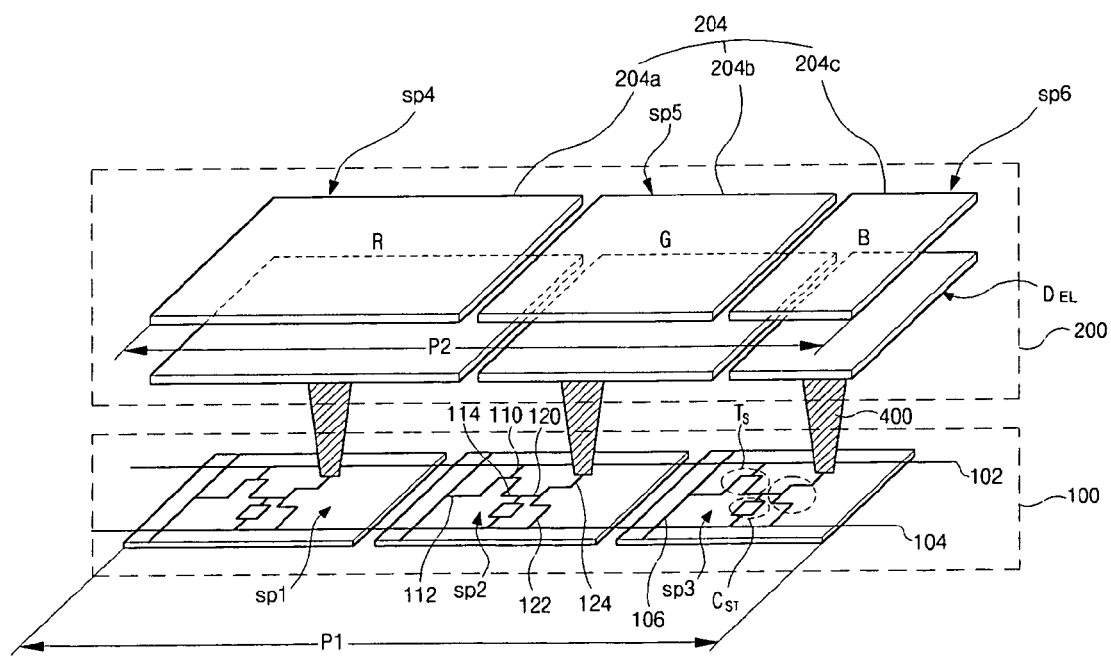
FIG. 4 is a perspective view illustrating one pixel region shown in FIG. 3.

FIG. 4 is a perspective view illustrating one pixel region shown in FIG. 3. Referring to FIG. 4, a gate line and a power line 102 and 104 are spaced apart from each other in a same direction, and a data line 106 crosses the gate and power lines 102 and 104. The sub-pixel regions "sp1" to "sp6" are defined by the gate line 102, the power line 104 and data line 106. The gate, data and power lines 102, 106 and 104 are formed in each sub-pixel region "sp." Although not shown in FIG. 4, the power line 104 may cross the gate line 102 and may be spaced apart from the data line 106.

A TFT "T" is formed on an inner surface of the first substrate 100 and adjacent to the sub-pixel region "sp." The TFT "T" includes a switching TFT "$T_S$" and a driving TFT "$T_D$" in each sub-pixel region "sp." The switching TFT "$T_S$" is connected to the gate and data lines 102 and 106, the driving TFT "$T_D$" is connected to the switching TFT "$T_S$" and the power line 104. The driving TFT "$T_D$" is also connected to the second electrode of the organic EL diode "$D_{EL}$" (not shown) by the connection electrode 400. The switching TFT "$T_S$" includes a switching gate electrode 110 that is connected to the gate line 102, a switching source electrode 112 that is connected to the data line 106, and a switching drain electrode 114 that is connected to the driving TFT "$T_D$." In addition, the driving TFT "$T_D$" includes a driving gate electrode 120 that is connected to the switching drain electrode 114, a driving source electrode 122 that is connected to the power line 104, and a driving drain electrode 124 that is connected to the connection electrode 400. In addition, a storage capacitor "$C_{ST}$" is formed between the switching drain electrode 114 and the power line 104. However, the storage capacitor "$C_{ST}$" may be formed in substantially any manner desired.

Meanwhile, the red, green and blue color filters 204a, 204b and 204c are formed on an inner surface of the second substrate 200 in each of the sub-pixel regions "sp4" to "sp6" of the second pixel region "P2" shown in FIG. 3. Since the sub-pixel regions "sp4", "sp5" and "sp6" of the second pixel region "P2" have different sizes from each other, the red, green and blue color filters 204a, 204b and 204c corresponding to the sub-pixel regions "sp4", "sp5" and "sp6," respectively, also have different sizes from each other. In addition, an organic EL diode "$D_{EL}$" is formed on the red, green and blue color filters in each of the sub-pixel regions "sp4" to "sp6" of the second pixel region "P2" shown in FIG. 3. Although not shown in FIG. 4, the organic EL diode "$D_{EL}$" includes the first and second electrodes 208 and 212 and the organic EL layer 210 therebetween, as shown in FIG. 3. Specifically, the second electrode is independently formed in each sub-pixel region "sp." Since the sub-pixel regions "sp4", "sp5" and "sp6" of the second pixel region "P2" have different sizes from each other, the plurality of the second electrodes 212 (of FIG. 3) have different sizes from each other. For example, the fourth sub-pixel region "sp4" is larger than the fifth and sixth sub-pixel regions "sp5" and "sp6," and the fifth sub-pixel region "sp5" is larger than the sixth sub-pixel region "sp6," as shown in FIG. 4.

The plurality of the driving TFTs "$T_D$" on the first substrate 100 are located in each of the sub-pixel regions "sp1" to "sp3" of the first pixel region "P1," and the sub-pixel regions "sp1" to "sp3" have the same size. In addition, the plurality of organic EL diodes "$D_{EL}$" are located in each of the sub-pixel regions "sp4" to "sp6" of the second pixel region "P2," and the sub-pixel regions "sp4" to "sp6" have different sizes from each other. Accordingly, when the connection electrode 400 electrically connects the first substrate 100 to the second substrate 200, the sub-pixels "sp1" to "sp3" of the first substrate 100 have different sizes from the sub-pixels "sp4" to "sp6" of the second substrate 200.

Although not shown, a dual panel type organic ELD according to the present invention may have red, green and blue organic EL layers as a full-color element, instead of the color filter layer 204. In this case, the red, green and blue organic EL layers correspond to the sub-pixel regions "sp4" to "sp6" of the second pixel region, respectively. Thus, the red, green and blue organic EL layers have different sizes from each other as in the case of the plurality of the second electrodes. For example, the red organic EL layer is larger than the green and blue organic EL layers, and the green organic EL layer is larger than the blue organic EL layer.

FIGS. 5A to 5D are schematic cross-sectional views illustrating a fabrication process for a substrate of the organic ELD according to the embodiment of present invention.

Figure 5A:
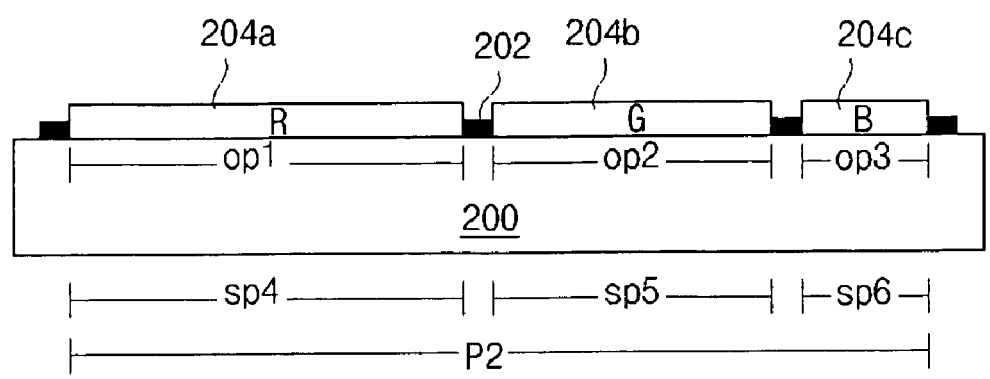
FIGS. 5A to 5D are schematic cross-sectional views illustrating a fabrication process for a substrate of an organic ELD according to an embodiment of present invention.

Referring to FIG. 5A, a black matrix 202 is formed on the second substrate 200 shown in FIG. 4 and includes a plurality of open portions "op1", "op2" and "op3," which have different sizes from each other. The fourth, fifth and sixth sub-pixel regions "sp4", "sp5" and "sp6" (shown in FIG. 4) correspond to the open portions "op1", "op2" and "op3," respectively. The black matrix 202 is formed by patterning a black resin or an opaque material. In addition, red, green and blue color filters 204a, 204b and 204c are formed in the open portions "op1", "op2" and "op3." The red, green and blue color filters 204a, 204b and 204c are formed by coating a color resin in each of the sub-pixel regions "sp4", "sp5" and "sp6," and have different sizes from each other. For example, the red color filter 204a is larger than the green blue color filters 204b and 204c, and the green color filter 204b is larger than the blue color filter 204c, as shown in FIG. 5A. However, a total size of the red, green and blue color filters 204a, 204b and 204c does not exceed the size of one pixel region (e.g., the first pixel region "P1" or the second pixel region "P2" shown FIG. 3).

Figure 5B:
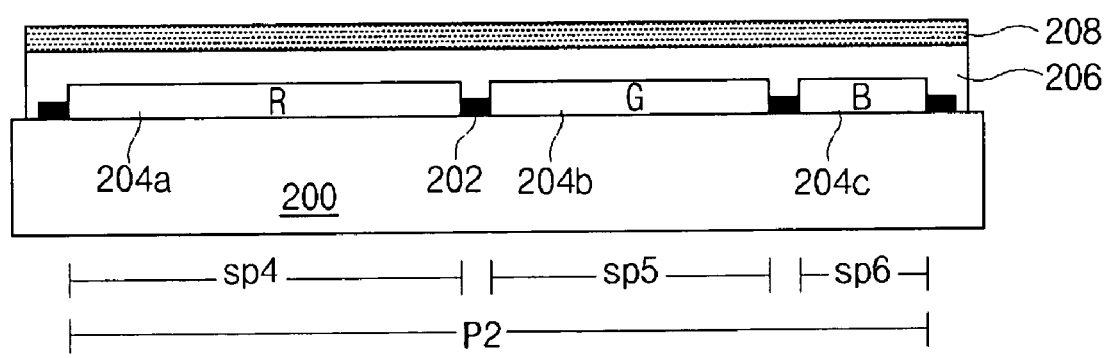

Referring to FIG. 5B, an overcoat layer 206 is formed on the red, green and blue color filters 204a, 204b and 204c, and the black matrix 202. The overcoat layer 206 is made of an organic material such as benzocylcobutene (BCB), acrylic resin, or the like. The overcoat layer 206 not only protects the color filter layer having the red, green and blue color filters 204a, 204b and 204c, but it also contributes to uniformity of the connection electrodes and organic EL layer (not shown). And then, a first electrode 208 is formed on the overcoat layer 206. The first electrode 208 is made of a transparent conductive material such as indium tin oxide (ITO), indium zinc oxide (IZO), indium tin zinc oxide (ITZO), or the like. Since the first electrode 208 is made of a transparent conductive material, the dual panel type organic ELD according to the present invention can be a top emission type.

Figure 5C:
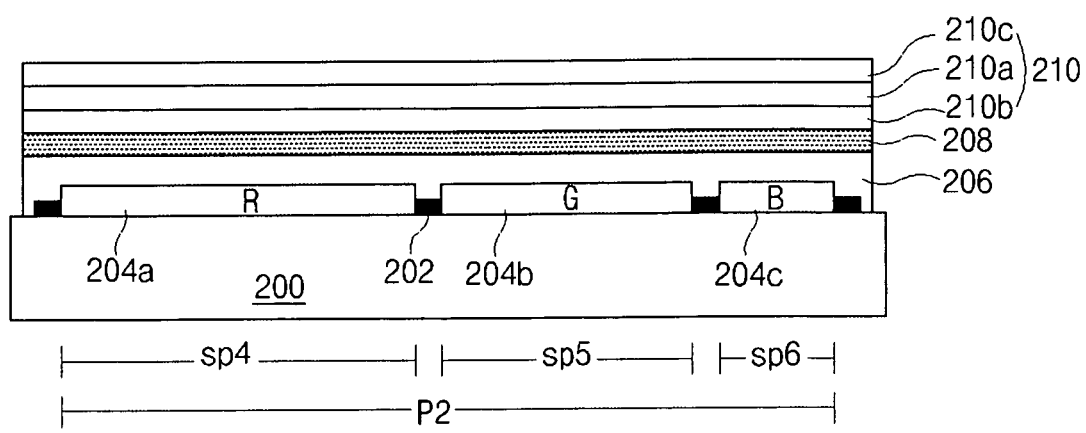

Referring to FIG. 5C, an organic EL layer 210 is formed on the first electrode 208, the organic EL layer 210 includes a single color emission layer 210a (e.g., a white color emission layer), a first current transmitting layer 210b formed between the first electrode 208 and the emission layer 210a, and a second current transmitting layer 210c formed on the emission layer 210a.

Figure 5D:
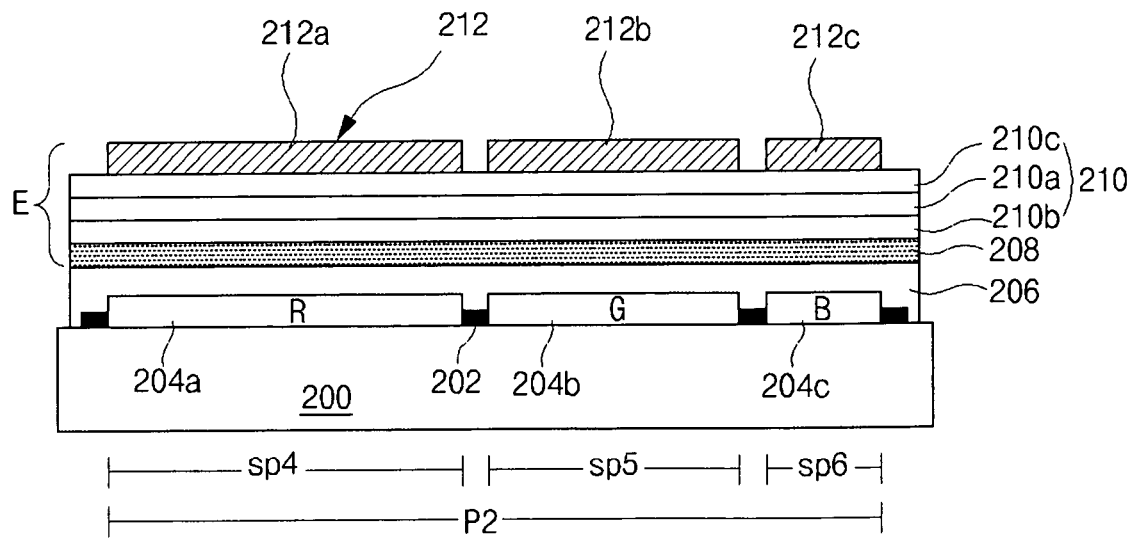

In FIG. 5D, a plurality of second electrodes 212a, 212b and 212c are formed on the organic EL layer 210. The second electrodes are made of an opaque material having a high reflectivity. The second electrodes 212a, 212b and 212c are formed in the sub-pixel regions "sp4" to "sp6" of the second pixel region "P2," respectively. When the first and second electrodes 208 and 212 function as an anode and a cathode, respectively, the first current transmitting layer 210a further includes a hole injection layer and a hole transporting layer, and the second current transmitting layer 210c further includes an electron injection layer and an electron transporting layer.

It should be noted that the second electrodes 212a, 212b and 212c correspond to the sub-pixel regions "sp4", "sp5" and "sp6" of the second pixel region "P2," respectively, and that the second electrodes "212a," "212b" and "212c" corresponding to the fourth, fifth and sixth sub-pixel regions "sp4", "sp5" and "sp6" (and the red, green and blue color filters) have different sizes from each other. For example, when the red color filter 204a is larger than the green and blue color filters 204b and 204c, and the green color filter 204b is larger than the blue color filter 204c, the second electrode 212a corresponding to the red color filter 204a is larger than the second electrodes 212b and 212c, and the second electrode 212b corresponding to the green color filter 204b is larger than the second electrode 212 corresponding to the blue color filter 204c.

The first and the second electrodes 208 and 212, and the organic EL layer therebetween constitute an organic EL diode "$D_{EL}$." The first and second substrates 208 and 212 are attached to each other with the seal pattern 300 therebetween. The first and second substrates 208 and 212 are encapsulated by an attachment process, and the organic EL diode "$D_{EL}$" and the array element layer 150 are electrically connected by the plurality of the connection electrodes 400 shown in FIG. 3. The connection electrodes 400 may be formed on the first electrode 208 and be connected to the TFT "T" (e.g., drain electrode of a driving TFT) with an additional pattern.

Figure 6:
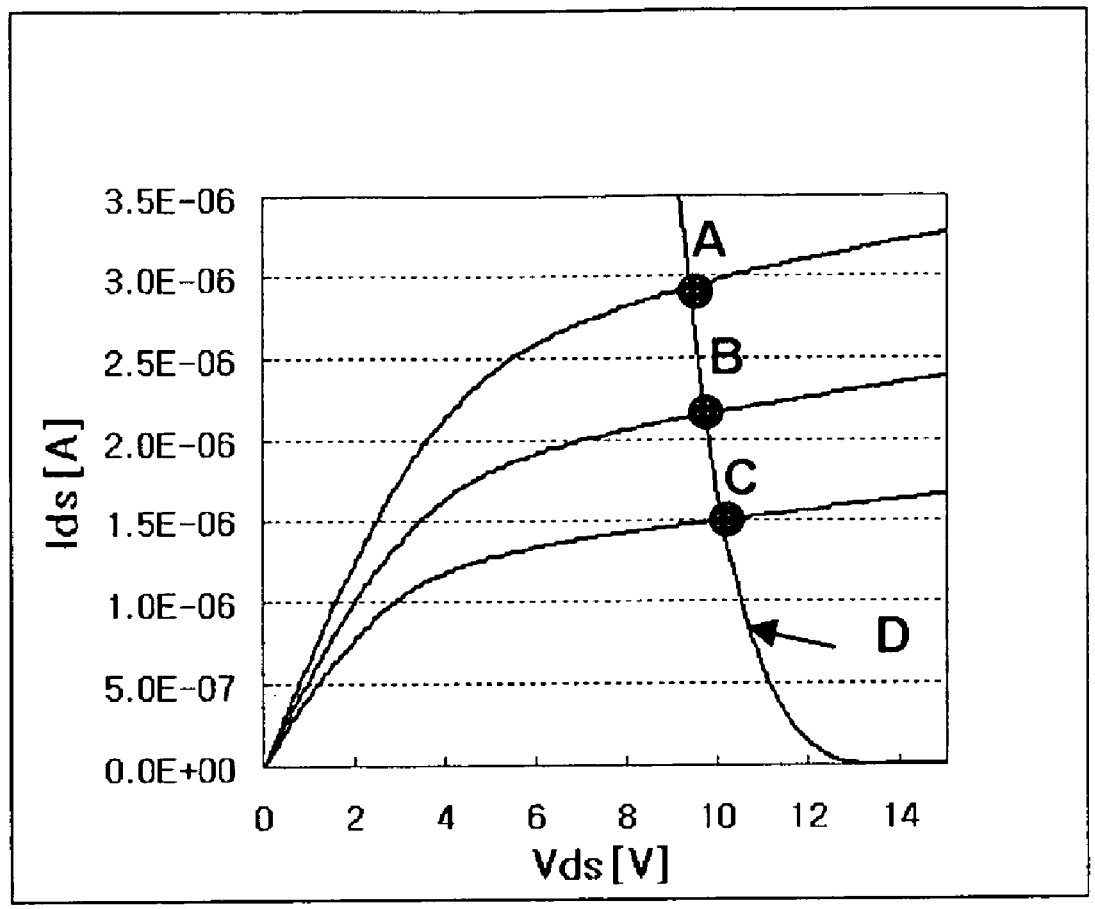
FIG. 6 is a graph illustrating different voltages applied to the red, green and blue sub-pixel regions of a white emission type organic ELD by an independent driving method according to an embodiment of the present invention.

FIG. 6 is a graph illustrating different voltages applied to the red, green and blue sub-pixel regions of a white emission type organic ELD by an independent driving method according to an embodiment of the present invention. Referring to FIG. 6, "A", "B" and "C" indicates exemplary output-currents of driving TFTs corresponding to the red, green and blue sub-pixel regions of the organic ELD. As shown in FIG. 6, data voltages supplied from a data line to each sub-pixel are different, and red, green and blue color brightnesses are obtained by the different currents. However, according to the present invention, because the size of the sub-pixel requiring the highest current is the largest, the current density of the sub-pixel having the largest size does not increase. Accordingly, life-time reduction of the organic ELD caused by current stress can be minimized. A formula of the sub-pixel region size and emission brightness will be set forth hereinafter.

$$Lt=[Lr^*(Ar/At)+Lg^*(Ag/At)+Lb^*(Ab/At)]/At$$

In the formula, "Lt" is brightness of the red, green and blue sub-pixel regions, "At" is a total emission size of the red, green and blue sub-pixel regions. In addition, "Lr," "Lg" and "Lb" are brightnesses of the red, green and blue sub-pixel regions, "Ar," "Ag" and "Ab" are emission sizes of the red, green and blue sub-pixel regions, respectively. According to the related art, "Ar," "Ag" and "Ab" have the same value, and "Lr," "Lg" and "Lb" are directly changed by an independent driving method, thus the current densities in each sub-pixel region are different from each other. Therefore, thermalization of the organic ELD and the life-time reduction occurs. On the other hand, in the present invention, "Lr," "Lg" and "Lb" have the same value, and "Ar," "Ag" and "Ab" are different from each other, thereby controlling brightness ratio.

Accordingly, according to the present invention, although current amounts that are applied to the red, green and blue sub-pixel regions are different from each other, because the red, green and blue sub-pixel regions have different sizes from each other, the current density of the sub-pixel region requiring the highest current level can be lowered, thereby preventing thermalization of the organic ELD and minimizing the life-time reduction caused by current stress. Accordingly, an organic ELD according to the present invention has a high lifetime.

An organic ELD and a method of fabricating the same according to the present invention have further advantages. First, production yield and production management efficiency are improved. Second, since an organic EL device according to the present invention is a top emission-type, a thin film transistor can be easily designed, and a high aperture ratio and a high image resolution may be obtained. Third, since the red, green and blue sub-pixel regions of the array-element substrate have the same size, and the red, green and blue sub-pixel regions of the organic EL diode substrate have different sizes from each other, a current density of the sub-pixel region requiring the highest current level can be lowered. In other words, although the red, green and blue sub-pixel regions are independently driven by different driving voltages, thermalization of the organic ELD can be minimized, and lifetime of the organic ELD increases.

Figure 7:
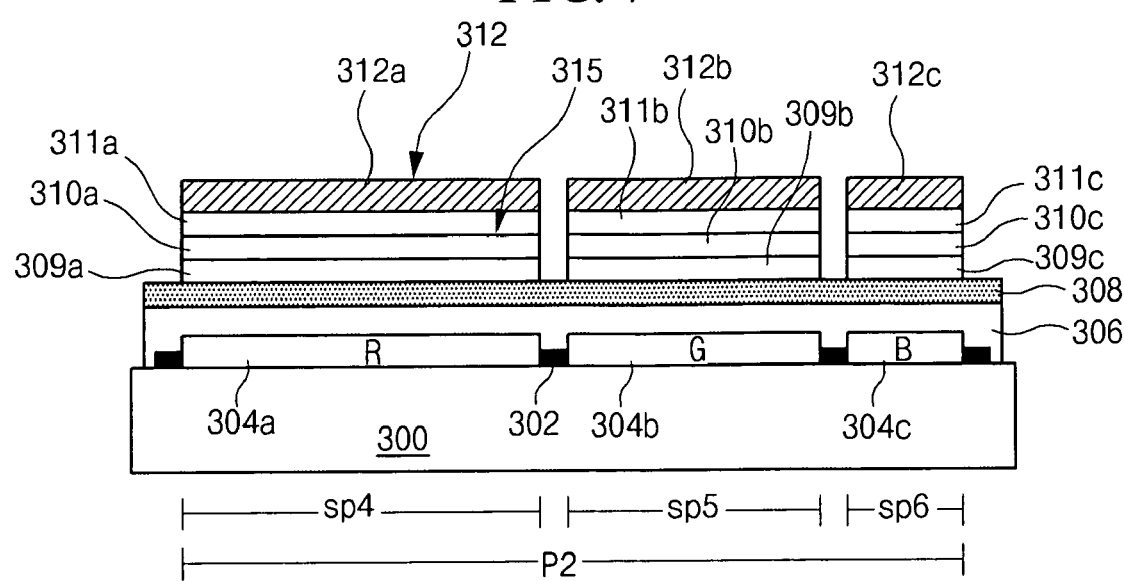
FIG. 7 is a schematic cross-sectional view illustrating an upper substrate for a top emission type organic ELD having a dual panel structure according to an embodiment of the present invention.

FIG. 7 is a schematic cross-sectional view illustrating an upper substrate for a top emission type organic ELD having a dual panel structure according to an embodiment of the present invention. As shown, the second pixel region "P2" is defined in the second substrate 300. The second pixel region "P2" includes the fourth, fifth and sixth sub-pixel regions "sp4", "sp5" and "sp6". The sub-pixel regions "sp4", "sp5" and "sp6" of the second pixel region "P2" have different sizes from each other. The fourth, fifth and sixth sub-pixel regions "sp4", "sp5" and "sp6" emit red, green and blue colors, respectively.

A black matrix 302 is formed on an inner surface of the second substrate 300 and includes open portions corresponding to the sub-pixel regions "sp4", "sp5" or "sp6" of the second pixel regions "P2." In addition, red, green and blue color filters 304a, 304b and 304c are formed in the first, second and third open portions of the black matrix 302 in the second pixel region "P2," respectively. Since the first, second and third open portions corresponding to the fourth, fifth and sixth sub-pixel regions "sp4", "sp5" and "sp6" have different sizes from each other, the sizes of the red, green and blue color filters 304a, 304b and 304c corresponding to the first to third open portions are also different from each other. The red color filter 304a is larger than the green and blue color filters 304b and 304c, and the green color filter 304b is larger than the blue color filter 304c. However, a total size of the red, green and blue color filters 304a, 304b and 304c does not exceed the size of the second pixel region "P2." The red, green and blue color filters 304a, 304b and 304c constitute a color filter layer.

The overcoat layer 306 is formed on the color filters 304a, 304b and 304c and the black matrix 302. This protects the color filters 304a, 304b and 304c, and also contributes to uniformity of the connection electrodes and an organic EL layer that will be explained below. The first electrode 308 is formed on the overcoat layer 306, an organic EL layer 315 is formed on the first electrode 308. The organic EL layer 315 includes a plurality of organic EL patterns. The plurality of organic EL patterns correspond to the each of the sub-pixel regions "sp4", "sp5" and "sp6" . A first organic EL pattern corresponding to the fourth sub-pixel "sp4" includes first, second and third layers 309a, 310a and 311a. A second organic EL pattern corresponding to the fifth sub-pixel "sp5" includes fourth, fifth and sixth layers 309b, 310b and 311b, and a third organic EL pattern corresponding to the sixth sub-pixel "sp6" includes seventh, eighth and ninth layers 309c, 310c and 311c. Accordingly, the first organic EL pattern is larger than the second and third organic EL patterns, and the second organic EL pattern is larger than the third organic EL pattern. The plurality of second electrodes 312a, 312b and 312c are formed on the organic EL layer 315. The second electrodes 312a, 312b and 312c are formed in the sub-pixel regions "sp4", "sp5" or "sp6" of the second pixel region "P2," respectively. The first and the second electrodes 308 and 312, and the organic EL layer 315 therebetween constitute an organic EL diode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
a first substrate including a first pixel region, the first pixel region including first, second and third sub-pixel regions having substantially the same size;
an array element layer on an inner surface of the first substrate, the array element layer including a thin film transistor in each sub-pixel region;
a second substrate facing the first substrate and being spaced apart from the first substrate, the second substrate including a second pixel region corresponding to the first pixel region, and the second pixel region including fourth, fifth and sixth sub-pixel regions;
an organic electroluminescent diode on an inner surface of the second substrate in each sub-pixel region; and
a connection electrode electrically connecting the first substrate to the second substrates, wherein the fourth, fifth and sixth sub-pixel regions have different sizes from each other, wherein the connection electrode connects a second electrode and a thin film transistor in each sub-pixel region, and wherein the thin film transistor includes a switching thin film transistor and a driving thin film transistor in each sub-pixel region, and the driving thin film transistor is substantially connected to the second electrode.

2. The device according to claim 1, wherein the organic electroluminescent diode includes a first electrode on the second substrate, an organic electroluminescent layer on the first electrode, and the second electrode on the organic electroluminescent layer.

3. The device according to claim 1, further comprising first, second and third second electrodes in the second pixel region, each of the first, second and third second electrodes sequentially corresponding to the fourth, fifth and sixth sub pixel regions, and each of the first, second and third second electrodes is the second electrode in each sub pixel region.

4. The device according to claim 3, wherein area of each sub pixel region of the second pixel region is inversely proportional to brightness thereof.

5. The device according to claim 1, further comprising red, green and blue emitting layers in the second pixel region, the red, green and blue emitting layers have different sizes from each other, and each of the red, green and blue emitting layers is the organic electroluminescent layer in each sub-pixel region.

6. The device according to claim 5, wherein the fourth sub-pixel region corresponding to the red emitting layer is larger than the fifth and sixth sub-pixel regions, and the fifth sub-pixel region corresponding to the green emitting layer is larger than the sixth sub-pixel region corresponding to the blue emitting layer.

7. The device according to claim 6, wherein the organic electroluminescent diode includes a first electrode on the second substrate, an organic electroluminescent layer on the first electrode, and a second electrode on the organic electroluminescent layer.

8. The device according to claim 6, wherein size of each sub-pixel region of the second pixel region is inversely proportional to brightness thereof.

9. The device according to claim 1, further comprising a color filter layer between the second substrate and the organic electroluminescent diodes, the color filter layer including red, green and blue color filters, and each of the red, green and blue color filters in each sub-pixel region.

10. The device according to claim 9, further comprising first, second and third second electrodes in the second pixel region, the first, second and third second electrodes have different sizes from each other, and each of the first, second and third second electrodes is the second electrode in each sub-pixel region.

11. The device according to claim 9, wherein the fourth sub-pixel region corresponding to the red emitting layer is biggest of the fifth and sixth sub-pixel regions, and the fifth sub-pixel region corresponding to the green emitting layer is bigger than the sixth sub-pixel region corresponding to the blue emitting layer.

12. The device according to claim 11, further comprising first, second and third second electrodes in the second pixel region, each of the first, second and third second electrodes sequentially corresponding to the fourth, fifth and sixth sub-pixel region, and each of the first, second and third second electrodes is the second electrode in each sub-pixel region.

13. The device according to claim 9, further comprising a black matrix on an entire surface of the second substrate, the black matrix having open portions, each open portion corresponding to each sub-pixel region of the second pixel region, and each of the red, green and blue color filters color filter in each open portion.

14. The device according to claim 9, wherein the organic electroluminescent layer is a single color.

15. The device according to claim 14, wherein the single color is a white color.

16. The device according to claim 9, further comprising an overcoat layer between the color filter layer and the organic electroluminescent diode.

17. The device according to claim 1, wherein the organic electroluminescent layer includes a first current transmitting layer, an emission layer, a second current transmitting layer between the first electrode and the second electrode.

18. The device according to claim 1, further comprising: a gate line on an inner surface of the first substrate in each sub-pixel region; a data line crossing the gate lines in each sub-pixel region; and a power line connected to the thin film transistor in each sub-pixel region.

19. The device according to claim 1, wherein the first, second and third sub-pixel regions have corresponding sizes to each other.

20. A method of fabricating an organic electroluminescent device, comprising:

forming an array element layer on a first substrate, the first substrate having a first pixel region, the first pixel region including first, second and third sub-pixel regions, and the array element including a thin film transistor in each sub-pixel region;

forming an organic electroluminescent diode on a second substrate, the organic electroluminescent diode including a first electrode on the second substrate, an organic electroluminescent layer on the first electrode, and a second electrode on the organic electroluminescent layer, the second substrate facing the first substrate and being spaced apart from the first substrate, the second substrate including a second pixel region corresponding to the first pixel region, and the second pixel region including fourth, fifth and sixth sub-pixel regions; and electrically connecting the first substrate to the second substrate by a connection electrode, wherein the fourth, fifth and sixth sub-pixel regions have different sizes from each other, wherein the connection electrode connects the second electrode and a thin film transistor in each sub-pixel region, and wherein the thin film transistor includes a switching thin film transistor and a driving thin film transistor in each sub-pixel region, and the driving thin film transistor is substantially connected to the second electrode.

21. The method according to claim 20, further comprising first, second and third second electrodes in the second pixel region, each of the first, second and third second electrodes sequentially corresponding to the fourth, fifth and sixth sub-pixel region, and each of the first, second and third second electrodes is the second electrode in each sub-pixel region.

22. The method according to claim 21, wherein size of each sub-pixel region of the second pixel region is inversely proportional to brightness thereof.

23. The method according to claim 22, wherein the fourth sub-pixel region corresponding to the red emitting layer is larger than the fifth and sixth sub-pixel regions, and the fifth sub-pixel region corresponding to the green emitting layer is larger than the sixth sub-pixel region corresponding to the blue emitting layer.

24. The method according to claim 23, wherein the plurality of organic electroluminescent diodes corresponding to the second pixel region includes first, second and third second electrodes, and each of the first, second and third second electrodes corresponding to each of the fourth, fifth and sixth sub-pixel regions.

25. The method according to claim 22, wherein the fourth sub-pixel region corresponding to the red emitting layer is biggest of the fourth, fifth and sixth sub-pixel regions, and the fifth sub-pixel region corresponding to the green emitting layer is bigger than the sixth sub-pixel region corresponding to the blue emitting layer.

26. The method according to claim 20, further comprising red, green and blue emitting layers in the second pixel region, the red, green and blue emitting layers have different sizes from each other, and each of the red, green and blue emitting layers is the organic electroluminescent layer in each sub-pixel region.

27. The method according to claim 26, wherein each of sizes of fourth, fifth and sixth sub-pixel regions is an inverse proportion for a brightness ratio.

28. The method according to claim 20, further comprising a color filter layer between the second substrate and the organic electroluminescent diodes, the color filter layer including red, green and blue color filters, and each of the red, green and blue color filters in each sub-pixel region.

29. The method according to claim 28, further comprising first, second and third second electrodes in the second pixel region, the first, second and third second electrodes have different sizes from each other, and each of the first, second and third second electrodes is the second electrode in each sub-pixel region.

30. The method according to claim 28, wherein size of each sub-pixel region of the second pixel region is inversely proportional to brightness thereof.

31. The method according to claim 30, wherein the fourth sub-pixel region corresponding to the red color filter is biggest of the fourth, fifth and sixth sub-pixel regions, and the fifth sub-pixel region corresponding to the green color filter is bigger than the sixth sub-pixel region corresponding to the blue color filter.

32. The method according to claim 28, wherein the fourth sub-pixel region corresponding to the red emitting layer is biggest of the fifth and sixth sub-pixel regions, and the fifth sub-pixel region corresponding to the green emitting layer is bigger than the sixth sub-pixel region corresponding to the blue emitting layer.

33. The method according to claim 32, further comprising first, second and third second electrodes in the second pixel region, each of the first, second and third second electrodes sequentially corresponding to the fourth, fifth and sixth sub-pixel region, and each of the first, second and third second electrodes is the second electrode in each sub-pixel region.

34. The method according to claim 32, wherein the plurality of organic electroluminescent diodes corresponding to the second pixel region includes first, second and third second electrodes, and each of the first, second and third second electrodes corresponding to each of the fourth, fifth and sixth sub-pixel regions.

35. The method according to claim 28, further comprising a black matrix on an entire surface of the second substrate, the black matrix having open portions, each open portion corresponding to each sub-pixel region of the second pixel region, and each of the red, green and blue color filters color filter in each open portion.

36. The method according to claim 28, wherein the organic electroluminescent layer is a single color.

37. The method according to claim 36, wherein the single color is a white color.

38. The method according to claim 28, further comprising an overcoat layer between the color filter layer and the organic electroluminescent diode.

39. The method according to claim 28, wherein the plurality of organic electroluminescent diodes corresponding to the second pixel region includes first, second and third second electrodes, and each of the first, second and third second electrodes corresponding to each of the fourth, fifth and sixth sub-pixel regions.

40. The method according to claim 28, wherein each of sizes of fourth, fifth and sixth sub-pixel regions is an inverse proportion for a brightness ratio.

41. The method according to claim 28, further comprising a black matrix on an entire surface of the second substrate, wherein the black matrix having open portions corresponding to the fourth, fifth and sixth sub-pixel regions, and wherein each of the red, green and blue color filters color filter in each of the open portions.

42. The method according to claim 28, wherein the single color is a white color.

43. The method according to claim 28, further comprising an overcoat layer between the color filter layer and the organic electroluminescent diodes.

44. The method according to claim 20, wherein the organic electroluminescent layer includes a first current transmitting layer, an emission layer, a second current transmitting layer between the first electrode and the second electrode.

45. The method according to claim 44, wherein the driving thin film transistor is connected to the second electrode.

46. The method according to claim 20, further comprising: a gate line on an inner surface of the first substrate in each sub-pixel region; a data line crossing the gate lines in each sub-pixel region; and a power line connected to the thin film transistor in each sub-pixel region.

47. The method according to claim 20, wherein the first, second and third sub-pixel regions have corresponding sizes to each other.

48. The method according to claim 20, wherein each of the plurality of organic electroluminescent diodes includes a first electrode on the second substrate, an organic electroluminescent layer on the first electrode, and a second electrode on the organic electroluminescent layer in each of the fourth, fifth and sixth sub-pixel regions.

49. The method according to claim 20, wherein the plurality of organic electroluminescent diodes corresponding to the second pixel region includes first, second and third second electrodes, and each of the first, second and third second electrodes corresponding to each of the fourth, fifth and sixth sub-pixel regions.

50. The method according to claim 20, wherein the organic electroluminescent layer includes red, green and blue emitting layers, each of the red, green and blue emitting layers in each of the fourth, fifth and sixth sub-pixel regions sequentially.

51. The method according to claim 20, further comprising a color filter layer between the second substrate and the plurality of organic electroluminescent diodes, wherein the color filter layer includes red, green and blue color filters, and each of the red, green and blue color filters in each of fourth, fifth and sixth sub-pixel regions.

52. The method according to claim 20, wherein the organic electroluminescent layer is a single color.

53. The method according to claim 20, wherein each of the plurality of connection electrode connect the second electrode and each of the plurality of the thin film transistor.

54. The method according to claim 53, wherein each of the plurality of thin film transistors included a switching thin film transistor and a driving thin film transistor.

55. The method according to claim 20, wherein the organic electroluminescent layer includes a first current transmitting layer, an emission layer, a second current transmitting layer between the first electrode and the second electrode.

56. The method according to claim 20, further comprising: a plurality of gate lines on an inner surface of the first substrate in a first direction; a plurality of data lines crossing the plurality of the gate lines in a second direction; and a plurality of power lines connected to the plurality of thin film transistors.

57. The method according to claim 20, wherein each of the first, second and third sub-pixel regions has a corresponding size to each other.

* * * * *